(12) United States Patent
Kelly et al.

(10) Patent No.: US 6,559,075 B1
(45) Date of Patent: May 6, 2003

(54) METHOD OF SEPARATING TWO LAYERS OF MATERIAL FROM ONE ANOTHER AND ELECTRONIC COMPONENTS PRODUCED USING THIS PROCESS

(75) Inventors: Michael Kelly, Freising (DE); Oliver Ambacher, Neufahrn (DE); Martin Stutzmann, Erding (DE); Martin Brandt, München (DE); Roman Dimitrov, München (DE); Robert Handschuh, Garching/Alz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/283,907

(22) Filed: Apr. 1, 1999

Related U.S. Application Data

(63) Continuation of application No. PCT/DE97/02261, filed on Oct. 1, 1997.

(30) Foreign Application Priority Data

Oct. 1, 1996 (DE) .......................................... 196 40 594

(51) Int. Cl.[7] .................... H01L 21/26; H01L 21/324; H01L 21/42; H01L 21/477
(52) U.S. Cl. ........................................ 438/795; 438/977
(58) Field of Search .................. 438/795, FOR 106, 438/113, 333, 453

(56) References Cited

U.S. PATENT DOCUMENTS

| | | | |
|---|---|---|---|
| 3,808,550 A | * 4/1974 | Ashkin | ........................ 372/97 |
| 4,448,636 A | 5/1984 | Baber | |
| 4,846,931 A | 7/1989 | Gmitter et al. | |
| 4,883,561 A | 11/1989 | Gmitter et al. | |
| 5,465,009 A | 11/1995 | Drabik et al. | |
| 5,559,043 A | * 9/1996 | Bruel | ........................ 156/250 |
| 5,985,687 A | * 11/1999 | Bowers et al. | ................ 438/46 |
| 6,071,795 A | 6/2000 | Cheung et al. | |
| 6,159,824 A | * 12/2000 | Henley et al. | .............. 438/455 |

FOREIGN PATENT DOCUMENTS

| | | |
|---|---|---|
| DE | 3508469 A1 | 9/1986 |
| EP | 0718885 A2 | 6/1996 |
| EP | 0 987 741 A1 | 3/2000 |

OTHER PUBLICATIONS

"Optical patterning of GaN films", M.K. Kelly et al., Appl. Phys. Lett. 69(12), Sep. 16, 1996, pp. 1749–1751.

"Extreme selectivity in the lift–off of epitaxial GaAs films", Eli Yablonovitch et al., Appl. Phys. Lett. 51 (26), Dec. 28, 1987, pp. 2222–2224.

"On the Thermal Decomposition of GaN in Vacuum", R. Groh et al., pp. 353–357.

"Few Characteristics of Epitaxal GaN–Etching and Thermal Decomposition", Yasua Morimoto, J. Electrochem. Soc.: Solid–State Science and Technology, Oct. 1974, pp. 1383–1384.

C.R. Miskys et al.: "MOCVD–Epitaxy on Free–Standing HVPE–GaN Substrates", Phys. stat. sol. (a) 176, 443 (1999), pp. 443–446.

(List continued on next page.)

Primary Examiner—William David Coleman
(74) Attorney, Agent, or Firm—Laurence A. Greenberg; Werner H. Stemer; Ralph E. Locher

(57) ABSTRACT

A method of separating two layers of material from one another in such a way that the two separated layers of material are essentially fully preserved. An interface between the two layers of material at which the layers of material are to be separated, or a region in the vicinity of the interface, is exposed to electromagnetic radiation through one of the two layers of material. The electromagnetic radiation is absorbed at the interface or in the region in the vicinity of the interface and the absorbed radiation energy induces a decomposition of material at the interface.

28 Claims, 6 Drawing Sheets

OTHER PUBLICATIONS

L. Tsakalakos et al.: "Epitaxial ferroelectric (Pb,La)(Zr, Ti)O$_3$ thin films on stainless steel by excimer laser liftoff", Applied Physics letters, vol. 76, No. 2, Jan. 10, 2000, pp. 227–229.

"Photoassisted dry etching of GaN", R.T. Leonard et al., Appl. Phys. Lett. 68, Feb. 5, 1996, pp. 794–796.

"Laser–Induced Dry Lift–off Process", Young–Feng Lu et al., Jpn. J. Appl. Phys. vol. 34, 1995, pp. 1669–1670.

"Excimer–Laser Removal of SiO$_2$ Patterns from GaAs Substrates", Young–Feng Lu et al., Jpn. J. Appl. Phys., vol. 33, 1994, pp. 324–327.

* cited by examiner

METHOD OF SEPARATING TWO LAYERS OF MATERIAL FROM ONE ANOTHER AND ELECTRONIC COMPONENTS PRODUCED USING THIS PROCESS

CROSS-REFERENCE TO RELATED APPLICATIONS

This is a continuation of copending International Application PCT/DE97/02261, filed Oct. 1, 1997, which designated the United States.

BACKGROUND OF THE INVENTION

Field of the Invention

The invention lies in the field of semiconductor manufacture. Specifically, the invention relates to a method of separating two layers of material from one another, in particular for separating a semiconductor layer from a substrate. It further relates to electronic components produced using the method.

The term material layers is intended here to mean both layers of a single material and layer sequences or layer structures of different materials.

The production of products from semiconductors, for example electronic and optoelectronic components, typically requires a plurality of process steps, including the processes needed for growing semiconductor crystals and semiconductor layers, and for selective local removal and structuring of the layers. Many components consist in part of layer sequences of nonidentical semiconductor materials, which are epitaxially grown in monocrystalline form on a substrate.

As the process steps for structuring semiconductor layers or for separating two semiconductor layers from one another, etching processes are customarily used which erode the semiconductor layers starting from the semiconductor surface. Such processes often take place very slowly and require corrosive chemicals. Further, not every known semiconductor material system has an etching process which allows corresponding layers to be structured with tolerable outlay.

In particular, the semiconductor materials indium nitride, gallium nitride and aluminum nitride (InN, GaN and AlN) and mixed crystals or alloys thereof, which will be referred to together in the text below as "group III nitrides", are very difficult to etch chemically. No reliable wet chemical etching process is currently available for this material system. It is therefore necessary to use the technically very elaborate process of reactive ion etching (dry etching). However, this method allows only relatively low etching rates and requires poisonous and toxic gases (for example boron trichloride). Because etching processes act on the surface, it is usually necessary to control the rate and duration of the etching accurately in order to reach the desired depth.

Further, for some semiconductor materials, for example and in particular for group III nitrides, bulk crystals of them or of lattice-matched semiconductor materials cannot be produced, or can be produced only with great technical outlay. Substrates for growing such semiconductor layers are therefore only of very limited availability. For this reason it is common practice, in order to grow these semiconductor layers, as a replacement to use substrates of other materials which have properties unsatisfactory for subsequent process steps or for the operation of the component. For the growth of group III nitride layers, these are, for example, sapphire or silicon carbide substrates.

These "replacement" substrates entail problems such as unsuitable atomic lattice spacings and different coefficients of thermal expansion, which have detrimental effects on the material quality of the semiconductor layers grown on them. Further, some process steps such as the known cleavage of semiconductor layers in order to produce resonator mirrors of laser diodes in GaAs, are difficult or even impossible with these substrates.

In order to overcome these problems, various processes alternative to etching have to date been proposed for separating semiconductor layers or other layers from one another or from a problematic substrate.

In E. Yablonovitch et al., Appl. Phys. Lett. 51, 2222 (1987), U.S. Pat. No. 4,846,931, Thomas J. Gmitter and E. Yablonovitch, Jul. 11, 1989, it has been proposed to implement AlAs sacrificial layers in the GaAs/AlAs material system during the production process, which can then be dissolved using wet chemical means. This makes it possible to separate layers or structures from the substrate. However, because of the low lateral etching rate, this method is very time-consuming. For group III nitrides, furthermore, there exists no wet chemical etchant.

U.S. Pat. No. 4,448,636 describes a method for removing metal films from a substrate. There, the metal film is heated by light. An organic sacrificial layer between the substrate and the metal film is vaporized by the heat delivered and allows the metal layer to be removed. These organic intermediate layers cannot be employed, in particular, in the epitaxial growth of group III nitrides.

A comparable method has been described for removing silicon dioxide layers from gallium arsenide in Y.-F. Lu, Y. Aoyagi, Jpn. J. Appl. Phys. 34, L1669 (1995). There, as well, an organic intermediate layer is heated by light absorption and the $SiO_2$ layer is lifted off.

Y.-F. Lu et al., Jpn. J. Appl. Phys. 33, L324 (1994) further discloses the separation of $SiO_2$ strips from a GaAs layer using an excimer laser.

German patent DE 35 08 469 C2 describes a process for structuring layer sequences applied to a transparent substrate, in which the layers to be structured are exposed to laser radiation locally through a transparent substrate, and this laser radiation is absorbed in the layer to be structured.

Further, so-called laser ablation has been applied to many material systems in order to remove material. In this method, however, the surface is always destructively eroded and separation in two parts that can be used further is not possible.

Specifically for group III nitrides, Leonard and Bedair, Appl. Phys. Lett. 68, 794 (1996) describe the etching of GaN with a laser pulse under HCl gas and attribute it to a photochemical reaction involving hydrochloric acid.

Morimoto, J. Electrochem. Soc. 121, 1383 (1974) and Groh et al., physica status solidi (a) 26, 353 (1974) describe the thermally activated decomposition of GaN.

In Kelly et al., Appl. Phys. Lett. 69 (12), Sep. 16, 1996, p.1749–51 it is shown that group III nitrides can be laser-induced to undergo thermally activated composition. However, that process likewise involves a process that acts on the surface of the semiconductor layer and, in particular, leads to the destruction of the surface.

SUMMARY OF THE INVENTION

It is accordingly an object of the invention to provide an improved method of separating two layers of material from one another, which overcomes the above-mentioned disadvantages of the heretofore-known devices and methods of this general type and which is not subject to destruction, or only slight destruction, of the free surfaces of the semiconductor layers. The object is, in particular, to develop a method of separating group III nitride layers from sapphire or SiC substrates.

With the foregoing and other objects in view there is provided, in accordance with the invention, a method of separating two layers of material from one another and substantially completely preserving each of the two layers of material. The method comprises the following steps:

providing two layers of material having an interface boundary between the two layers;

irradiating the interface boundary between the two layers or a region in vicinity of the interface boundary with electromagnetic radiation through one of the two layers;

absorbing the electromagnetic radiation at the interface or in the region in the vicinity of the interface and inducing a material at the interface boundary to decompose; and separating the two layers of material.

In accordance with an added feature of the invention, a sacrificial layer is formed at the interface boundary and wherein the absorbing step comprises absorbing the radiation with the sacrificial layer and decomposing the sacrificial layer.

In accordance with an additional feature of the invention, the sacrificial layer is formed of a material having an optical band gap smaller than a band gap of one of the two layers.

In accordance with another feature of the invention, the decomposition is induced by converting an energy of the absorbed radiation into heat.

In accordance with a further feature of the invention, a temperature-sensitive sacrificial layer is formed at the boundary interface, and the absorbing step comprises absorbing the radiation in a part of one of the layers of material, diffusing the energy in form of heat into the temperature-sensitive sacrificial layer, and decomposing the sacrificial layer.

In accordance with again an added feature of the invention, the decomposition of the interface boundary is induced by generating gas, by means of a chemical reaction, sublimation, or another process, at the interface boundary with energy of the absorbed radiation.

In accordance with again an additional feature of the invention, one of the two layers of material is a substrate and the other of the two layers of material is a semiconductor layer, a semiconductor layer sequence, or a semiconductor layer structure, and the irradiating step comprises radiating the electromagnetic radiation through the substrate. Preferably, the semiconductor body is applied for mechanical stabilization on a support material.

In accordance with again another feature of the invention, the irradiating step comprises exposing the material to one or more light pulses. In a preferred mode, two or more coherent laser beams produce an interference pattern in the exposure. The local radiation intensity is thereby increased.

In accordance with again a further feature of the invention, the semiconductor body consists at least partially of GaN, AlN, InN, mixed crystals thereof, layer sequences, layer structures, and component structures thereof. Where the sacrificial layer is provided, it consists at least partially of a GaN, AlN, InN, or mixed crystals thereof.

With the above and other objects in view there is also provided, in accordance with the invention, a method of laterally structuring a semiconductor layer or a semiconductor layer sequence disposed on a substrate. The novel method comprises the following steps:

providing a substrate and a body of semiconductor material consisting essentially of at least one group III nitride material on the substrate, with an interface formed between the substrate and the semiconductor material;

The invention thus proposes to separate the two materials in that, through one of the two layers of material, the interface, or a region in the vicinity of the interface between the two layers, is exposed to electromagnetic radiation, and that a layer of material at or in proximity to the interface is decomposed by absorption of the radiation.

This process is an alternative to wet and dry chemical etching processes as are used in semiconductor technology for structuring and producing individual layers and components. It differs from them essentially in that it acts directly on an internal region at the interface between the two layers and not on the free surface. This makes it possible, amongst other things, to produce the desired structuring depth directly instead of, for example, defining it by accurately setting the duration and rate of the etching. In the process according to the invention, in addition, there is no destruction of one of the two layers of material. This leads to a novel possibility for detaching layer systems from one another or from the substrate. Cantilevered components or layers have advantages in further process steps; they are suitable, for example, as substrates for homoepitaxy without the problems of lattice mismatching and the differences in the coefficients of thermal expansion, or to produce optical components (laser diodes) through the possibility of cleavage irrespective of the substrate cleavability. The transfer of layers, layer systems and components of group III nitride materials to other substrates permits compatibility and integration of group III nitrides with other technologically relevant semiconductor systems such as silicon.

The process makes it possible to separate layers of a layer/substrate system through direct highly local action on internal interfaces or regions in proximity to interfaces. In general, the process described here can be applied to material systems in which the interface to be separated can be reached with electromagnetic radiation, in particular with light, the radiation is absorbed by a material at this interface, and in which material in proximity to the interface can be decomposed by the absorption of light or light pulses. The process is facilitated if at least one decomposition product is in the form of gas. Examples of suitable semiconductor materials for this process include group III nitrides, oxide materials and $Si_3N_4$.

Optoelectronic components such as light-emitting diodes and semiconductor lasers and electronic components such as transistors, diodes, surface acoustic wave components are typically produced in large numbers on a single substrate. In this case, the described process of light-induced structuring can be used for separating the individual components. The separation of the components from the substrate may, as mentioned above, take place through the decomposition of a sacrificial layer which needs to be introduced during the fabrication process under or over the surface to be separated. Thin InGaN layers are especially suitable for this because of their comparatively small band gap and their chemical stability.

The production of freestanding layers and layer sequences makes it possible to transfer layers of group III nitrides to other substrates (for example silicon) which may differ greatly in terms of their structural, mechanical and thermal properties from those of group III nitrides. The procedure makes it possible to combine light-emitting diodes and semiconductor lasers made of group III nitrides with conventional support materials for the production of flat display screens or the integration of such components in circuits and integrated circuitry. Cantilevered layer structures can also be used as optical waveguides and optical couplers. If this is structured with a diffraction grating, the light can be coupled in through the grating. Layers of specific thickness can also be employed as optical filters.

By means of exposure through a mask, exposure with coherent light beams combined with interference patterning, holography, or serial or simultaneous exposure of various selected locations, lateral structuring of one of the layers of material can be produced.

The essential steps in the method according to the invention are as follows:

(i) identification, selection or production of an interface to be separated in the desired layer system, which can be reached by the radiation to be used for separation;

(ii) identification of a material, or incorporation of a material as a sacrificial layer at the interface, which material absorbs the incident light; or (iii) identification or incorporation of a material as a sacrificial layer in proximity to the interface, which material can be made to decompose by the absorbed light or by the energy resulting therefrom, and produces a product in gas form in sufficient quantity during the decomposition; and (iv) exposure to radiation of a selected wavelength and intensity, so that the radiation is predominantly absorbed by the interface to be separated or by the sacrificial layer, and thereby stimulates the decomposition reaction, in the case of transparent substrates it also being possible for the interface or sacrificial layer to be exposed through the substrate.

The process according to the invention is, in particular, also usable for structuring semiconductor layers consisting of group III nitrides which, for example, are applied to SiC or sapphire substrates.

Other features which are considered as characteristic for the invention are set forth in the appended claims.

Although the invention is illustrated and described herein as embodied in a method of separating two layers of material from one another and electronic components produced using this process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Equivalent or functional equivalent components and features in the figures are identified with the same reference symbol throughout.

DESCRIPTION OF THE PREFERRED EMBODIMENTS

Figure 1:
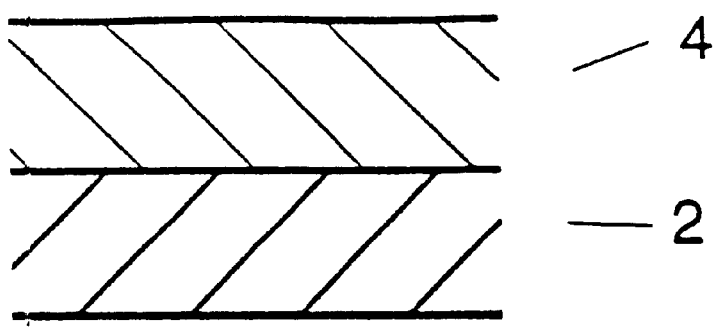
FIG. 1 is a partial schematic sectional side view of a first exemplary embodiment of the invention.
Figure 1:
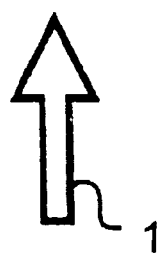

Referring now to the figures of the drawing in detail and first, particularly, to FIG. 1 thereof, there is seen a first embodiment with an interface of a layer system made up of a first semiconductor layer 2 and of a second semiconductor layer 4. The layer system is exposed to a laser beam 1 through the first semiconductor layer 2. The light is strongly absorbed in the material of the second semiconductor layer 4. The first semiconductor layer 2 is transparent to the laser beam 1.

The energy absorbed in the second semiconductor layer 4, predominantly in proximity to the interface between the two semiconductor layers 2, 4, induces for example decomposition of the semiconductor material of the second semiconductor layer 4 in that region. This brings about the separation of the two semiconductor layers 2 and 4. Examples of possible decomposition mechanisms include sublimation or chemical reactions. The decomposition may in this case be both thermally and photochemically initiated. The separation is, in particular, reinforced if products in gas form are produced during the decomposition.

It is, however, also possible for the energy absorbed in the semiconductor layer 4 to diffuse into the semiconductor material 2 and for the decomposition to take place there. The relative thickness of the two semiconductor materials may in this case vary greatly. The equal thickness measurements of FIG. 1 are not necessary. In that regard, the figures of the drawings are not necessarily drawn to scale.

One much-used method of producing semiconductor materials is growth on substrates. In terms of the process presented here, the distinction between substrate and semiconductor material is irrelevant. One possibility is for the semiconductor layers 2, 4 to be grown on a substrate and for the separation to take place at the interface between the semiconductor layers 2, 4.

Figure 2:
FIG. 2 is a partial schematic sectional side view of a second exemplary embodiment of the invention.
Figure 2:
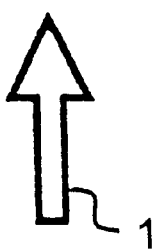

In the illustrative embodiment in FIG. 2, a semiconductor layer 4 is separated from a substrate 6. In order to do this, the semiconductor layer 4 is exposed to light 1 through the substrate 6 and the radiation energy is absorbed in the material of the semiconductor layer 4. Depending on the absorption properties, it may however also be possible to expose the interface through the semiconductor layer 4 so that the substrate 6 absorbs the light energy. As already presented above, it is not however necessary for the decomposition to take place in the absorbing part of the structure, and the energy may where appropriate also diffuse into the other part and bring about the decomposition there.

Figure 3:
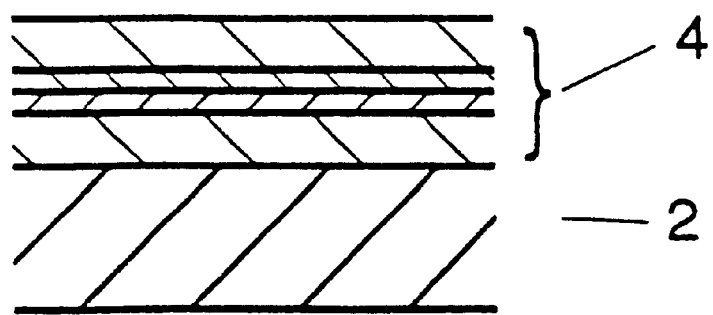
FIG. 3 is a partial schematic sectional side view of a third exemplary embodiment of the invention.

The semiconductor layers 2, 4 may either each be homogeneous layers of one semiconductor, or consist of layer sequences of different semiconductors, as indicated with reference to the example of the semiconductor layer 4 in FIG. 3. These layer sequences may already contain an actual component preprocessed or fully processed, even in the form of an integrated electronic or optoelectronic circuit. All these structures are in the context of the application to be interpreted as semiconductor layers.

Figure 4:
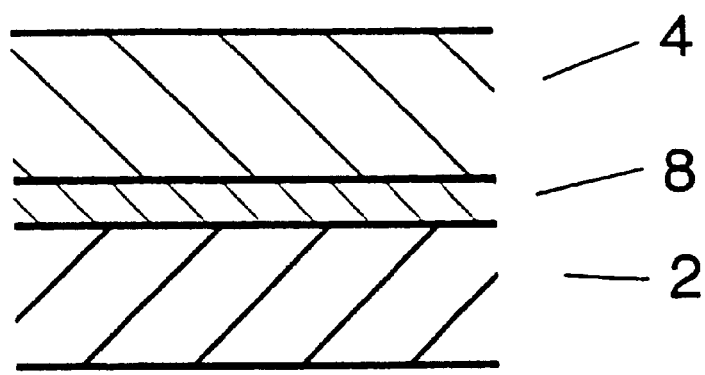
FIG. 4 is a partial schematic sectional side view of a fourth exemplary embodiment of the invention.
Figure 4:
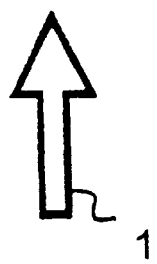

In order to improve and deliberately affect the absorption of the light at the interface to be separated, in accordance with the fourth illustrative embodiment according to FIG. 4 a special absorbing layer 8 may be interposed between a first semiconductor layer 2 and a second semiconductor layer 4, or between the substrate 6 and the semiconductor layer 4 (cf. FIG. 2). The absorbing layer 8, for example a semiconductor layer, has for example an optical band gap which is smaller than that of the surrounding materials. The layer 8 can then itself be decomposed and therefore act as a sacrificial layer. It is, however, also possible for the absorbed energy to diffuse and lead to decomposition and separation in proximity to the layer 8.

It is also possible for the energy to be absorbed in the semiconductor layer 4 but for the latter to be too stable to become decomposed. In this case, the layer 8 may be selected in such a way that it decomposes particularly readily, and thus again functions as a sacrificial layer. One particular advantage of the process described here is that the layer 8 may be crystalline and lattice-matched.

The electromagnetic radiation must be selected in such a way that it can reach the interface to be separated and be absorbed sufficiently there. This can be done in the simplest case by illumination using a lamp, if appropriate after filtering. If the photon flux which this provides is insufficient, the illumination may also be carried out using a suitable laser.

Particularly in the case of thermal decomposition, the heat may diffuse rapidly out of the region to be decomposed on account of the thermal conductivity of the materials. It may therefore be necessary to deliver the light energy in the form of very short light pulses, in order nevertheless to reach the temperature needed for the decomposition.

Figure 5:
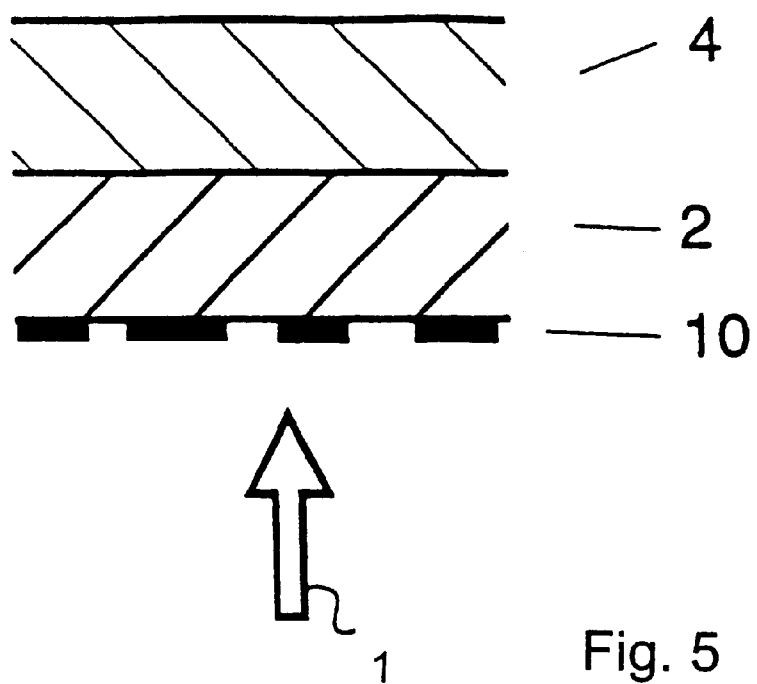
FIG. 5 is a partial schematic sectional side view of a fifth exemplary embodiment of the invention.

The process described here may also be used for lateral structuring. This can be carried out using various procedures. A focused light beam can be employed for sequentially exposing spatially separate points of the material and for bringing about the decomposition. As shown in the illustrative embodiment in FIG. 5, it is possible to use an exposure mask 10 through which selected areas of the sample can be removed.

Figure 6:
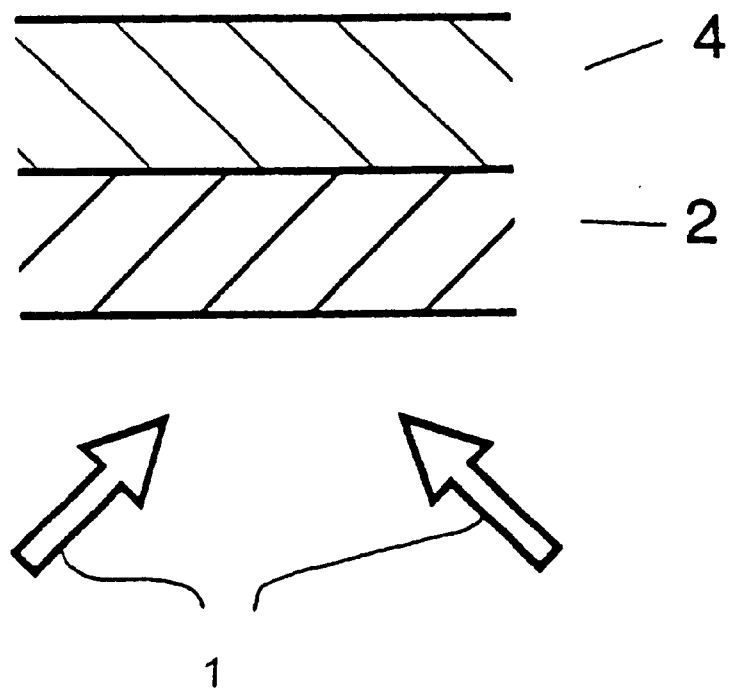
FIG. 6 is a partial schematic sectional side view of a sixth exemplary embodiment of the invention.

Likewise, in accordance with the illustrative embodiment in FIG. 6, exposure using holographic methods is possible (for example exposure with an interference grating), in which the interference effects are utilized through simultaneous exposure to more than one coherent beam.

The part separated by the interfacial decomposition may be very thin or small, and therefore mechanically unstable and difficult to process. It is possible to apply this part according to the illustrative embodiment in FIG. 7 before or after the separation, for example using adhesive 12, to a new support material 14. This is represented by way of example for the case of fixing before the interfacial decomposition in FIG. 7.

After the separation, a thin semiconductor layer 4, separated from the substrate 6, is then available on the support material.

Figure 8:
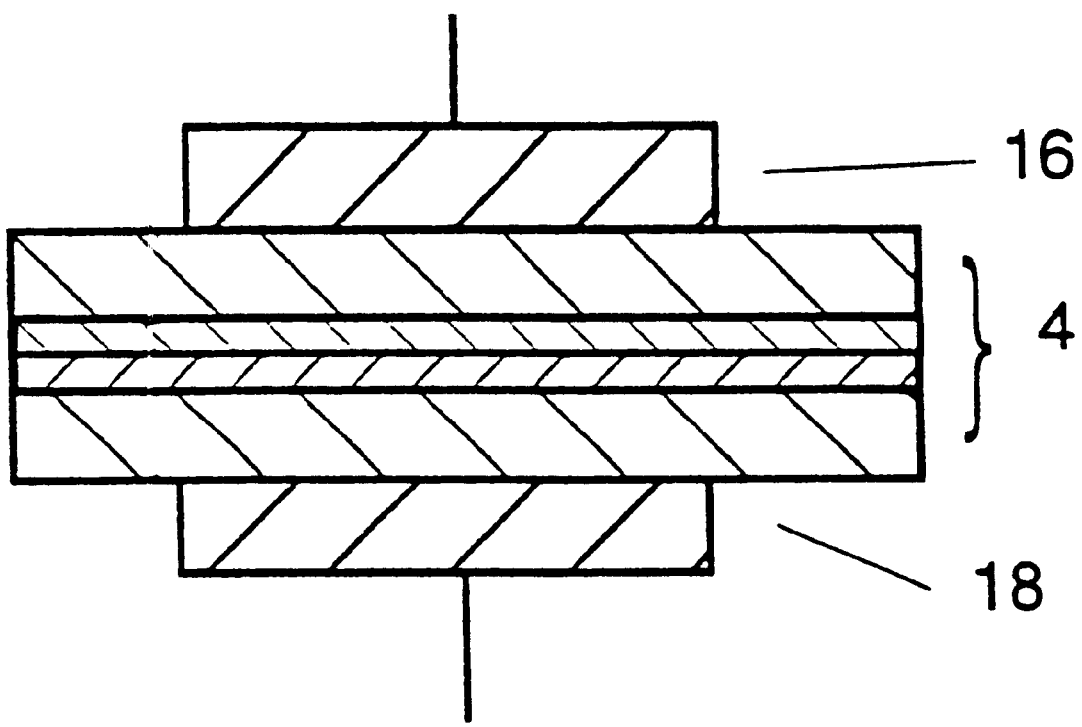
FIG. 8 is a partial schematic sectional side view of a eighth exemplary embodiment of the invention.

Particularly advantageously, the process according to the invention may be used for the production of layer sequences 4 or complete component structures of electronic or optoelectronic components, which are formed on nonconducting substrates. In these cases, it is often difficult, in addition to the electrical contact 16 arranged in each case on the other side of the layer sequence 4 or component structure from the substrate, to arrange an electrical contact on a semiconductor layer arranged in proximity to the substrate. In order to do this, complicated etching processes and the formation of mesa structures are usually necessary. With the process described here, according to the illustrative embodiment in FIG. 8 it is possible to detach layer sequences 4 or complete component structures from nonconducting substrates. The sides of the layer sequences 4 or component structures which are now free but previously faced the substrate are now readily accessible for electrical contacts 18.

The way in which this process is implemented depends on the material system. A preferred embodiment for semiconductor materials uses a material on the interface to be separated with a smaller band gap than all other layers or materials on one side of the interface. For exposure, a radiation wavelength is selected at which the radiation can penetrate as far as the interface, and which is absorbed by the material with smaller band gap. Decomposition in this or a neighboring material must thereby be inducible.

This process is particularly suitable for layers or layer systems of group III nitrides since this group of materials has some physical properties particularly advantageous for this process. Firstly, it is possible to heat group III nitrides above their decomposition temperature in a spatially delimited and controlled way through the absorption of individual light pulses. At the temperatures produced by the absorption of light pulses, the decomposition of the nitrides and the formation of nitrogen gas is initiated (600° C.–1800° C., depending on the composition of the nitrides). Secondly, the described procedure is assisted by the fact that the melting points of group III nitrides are far higher than the decomposition temperatures, so that during the absorption of intense light pulses the layers and components do not become damaged by melting. Thirdly, these semiconductor materials are especially suitable for optical processes since, as a function of the wavelength of the light, they have a well-defined sharp threshold, a direct band gap, at which they change from transparent to fully absorbing. Further, the wavelength from which the absorption starts can be varied using mixed crystals of the nitrides (InGaN and AlGaN) over a wide spectral range (band gaps: InN 1.9 eV, GaN 3.4 eV, AlN 6.2 eV). In addition, group III nitrides are often produced on sapphire substrates which are transparent throughout the optical and ultraviolet range. This even makes it possible to expose the layers through the substrate.

If the decomposition is thermally activated, it is important for it to be possible for the resultant heat to be concentrated onto the interface or the sacrificial layer, on the one hand in order to minimize the required incident intensity, and on the other hand in order to preclude the possibility of undesired effects on the surrounding material. Since the photogenerated quantity of heat is rapidly dissipated by the thermal conductivity of the materials out of the hot volumes, the requisite temperature must be produced in a very short time. This can be done using short laser pulses. For typical thermal conductivities of group III nitrides, the absorbed energy can be concentrated through the use of laser pulses with a period of 1 ns to 10 ns onto the penetration depth of the absorbed light or the thickness of the sacrificial layer. For the structuring and decomposition of group III nitrides, one suitable example is a "Q-switched" pulsed Nd:YAG laser.

Figure 7:
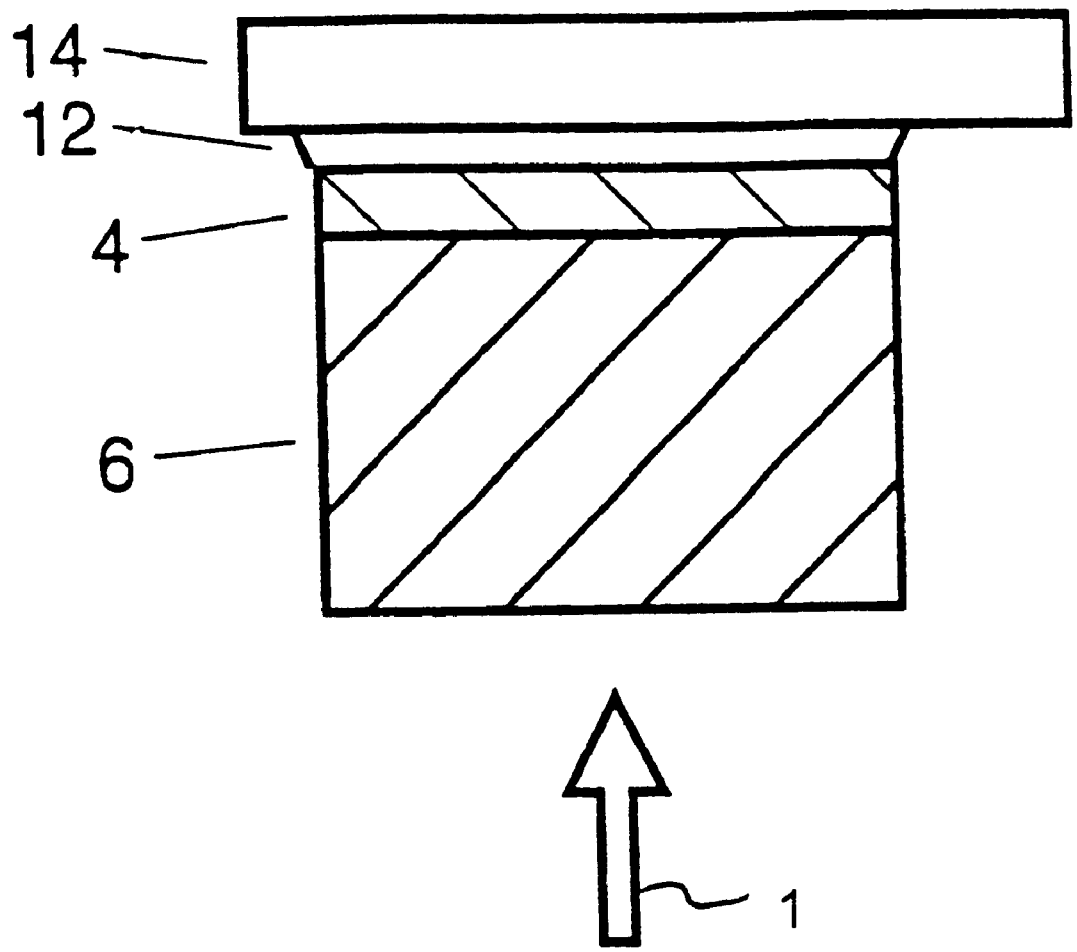
FIG. 7 is a partial schematic sectional side view of a seventh exemplary embodiment of the invention.

As a specific embodiment for the photoinduced decomposition of the materials GaN and InGaN (band gaps between 1.9 and 3.4 eV), the third harmonic laser line of an Nd:YAG laser may be used. This laser line is produced, for example, using a nonlinear optical crystal and has a wavelength of 355 nm (3.5 eV). GaN and InGaN layers absorb these light pulses and can be made to decompose. AlGaN layers and the customarily used sapphire substrate are transparent to this wavelength. Cantilevered GaN and InGaN layers can be produced directly by decomposition of the substrate/layer interface. AlGaN layers and components can be detached from the substrate by photoinduced decomposition of thin GaN or InGan sacrificial layers. FIG. 7 schematically shows the way of separating a GaN layer 4 from a sapphire substrate 6, polished on both sides. The interface between the GaN and the sapphire is exposed through the substrate to a single laser pulse of wavelength 355 nm. The laser radiation is absorbed by the GaN in proximity to the interface down to a depth of about 100 nm, as a result of which the interface becomes heated. If temperatures in excess of 850° C. are reached, the GaN starts to decompose with the formation of nitrogen gas. For pulse energies of more than about 0.2 J/cm$^2$, the energy density is sufficient for complete decomposition at the boundary between the substrate 6 and the GaN layer 4, as a result of which the bond between the substrate 6 and GaN layer 4 is separated in the exposed area. In order to stabilize the cantilevered layer, the sample may be bonded using a resin or wax 12 to a support wafer or sheet 14 via the side of the layer prior to the exposure. If the GaN layer 4 is separated from the substrate 6 by the decomposition reaction, the sapphire substrate 6 can be lifted off and the GaN layer 4 remains behind on the support wafer or sheet 14. The wax or resin can then be dissolved in acetone and the GaN layer remains behind as a cantilevered layer.

Figure 9:
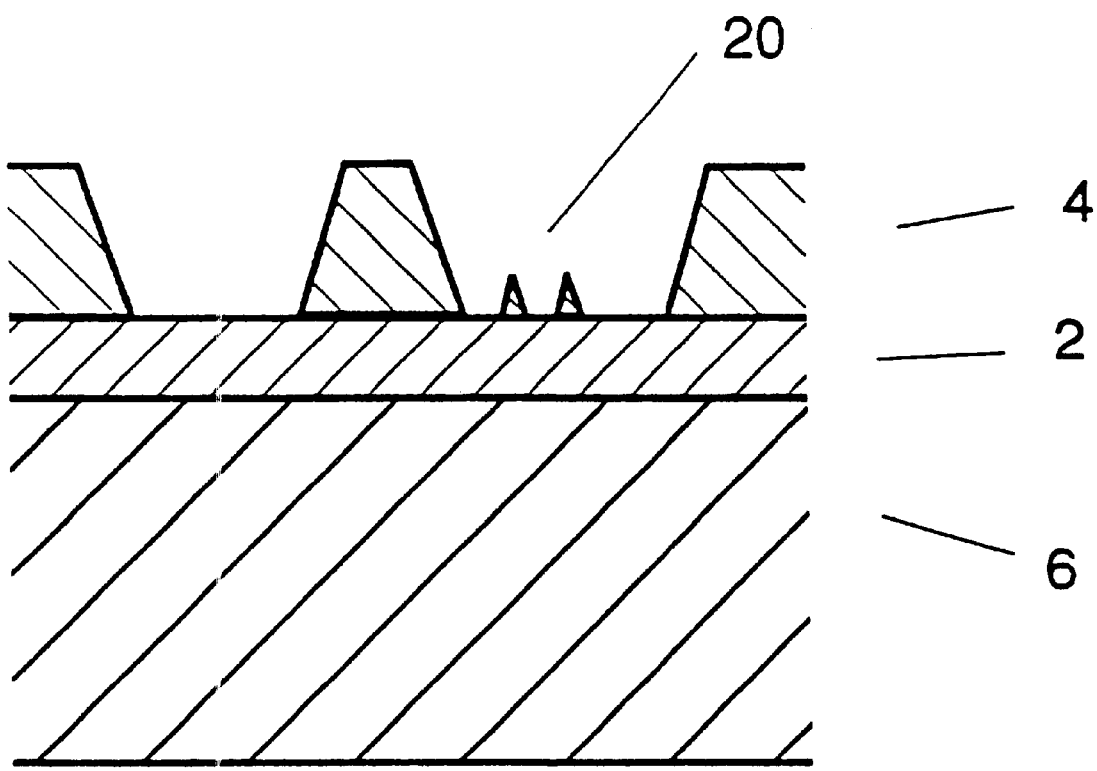
FIG. 9 is a partial schematic sectional side view of a ninth exemplary embodiment of the invention.

When structuring GaN layers by exposing the interface through a sapphire substrate, GaN structures with nonvertical, that is to say oblique side faces can be produced, which, as FIG. 9 shows, propagate from the decomposition site. This process can, for example, be used to produce structures 20 with a pointed or pyramidal design if the lateral width of the interference grating or the mask is matched to the layer thickness. This process also helps the production of cantilevered layers.

Various components made of group III nitrides can be structured using the described procedures. The fabrication of periodic line gratings and surface structures by exposure with an interference grating can advantageously be used to produce Bragg reflectors and distributed feedback lasers based on group III nitrides. It is also possible to obtain optical dispersion gratings, which if appropriate may also be used for transmitted light, through variation of the thickness of the layer by structuring with an interference grating. Pyramidal structures of AlN and AlGaN can, because of their negative electron affinity, be used as cold cathode emitters, for example, in flat display screens.

We claim:

1. A method of separating two layers of material from one another and substantially completely preserving each of the two layers of material, the method which comprises:
   providing two layers of material hating an interface boundary between the two layers;
   providing a sacrificial layer at the interface boundary, the sacrificial layer being formed of a material having an optical band gap smaller than a band gap of one of the two layers;
   irradiating the interface boundary between the two layers or a region in vicinity of the interface boundary with electromagnetic radiation through one of the two layers;
   absorbing the electromagnetic radiation at the interface or in the region in the vicinity of the interface with the sacrificial layer and decomposing the sacrificial layer; and
   separating the two layers of material.

2. The process according to claim 1, wherein the absorbing step comprises inducing the decomposition by converting an energy of the absorbed radiation into heat.

3. The process according to claim 1, which further comprises forming a temperature-sensitive sacrificial layer at the boundary interface, and wherein the absorbing step comprises absorbing the radiation in a part of one of the layers of material, diffusing the energy in form of heat into the temperature-sensitive sacrificial layer, and decomposing the sacrificial layer.

4. The process according to claim 1, wherein the absorbing step comprises inducing a decomposition of the interface boundary by generating gas at the interface boundary with energy of the absorbed radiation.

5. The process according to claim 4, wherein the step of generating the gas comprises inducing a process selected from the group consisting of chemical reactions and sublimation.

6. The process according to claim 1, wherein one of the two layers of material is a substrate and the other of the two layers of material is a semiconductor body selected from the group consisting of a semiconductor layer, a semiconductor layer sequence, and a semiconductor layer structure, and the irradiating step comprises radiating the electromagnetic radiation through the substrate.

7. The process according to claim 6, which comprises applying the semiconductor body for mechanical stabilization on a support material.

8. The process according to claim 1, wherein the irradiating step comprises exposing the material to one or more light pulses.

9. The process according to claim 1, wherein the irradiating step comprises irradiating with two or more coherent laser beams, producing an interference pattern in the exposure, and increasing a local light intensity.

10. A method of producing a freestanding component structure, which comprises separating, in accordance with the method according to claim 6, a component structure from a substrate during or after a manufacture thereof.

11. The method according to claim 10, wherein the component structure is a component selected from the group consisting of diodes, light-emitting diodes, semiconductor lasers, transistors, and detectors.

12. A method of producing a freestanding semiconductor laser structure, which comprises:
   separating the semiconductor laser structure from a substrate during or after a manufacture thereof and substantially completely preserving the material of the semiconductor laser structure and the substrate, including:
      providing two layers of material having an interface boundary between the two layers, one of the two layers of material being a substrate and the other of the two layers of material being a semiconductor laser structure;
      irradiating the interface boundary between the two layers or a region in vicinity of the interface boundary with electromagnetic radiation through the substrate;
      absorbing the electromagnetic radiation at the interface or in the region in the vicinity of the interface and inducing a material at the interface boundary to decompose; and separating the two layers of material; and producing an optical resonator of the semiconductor laser structure by cleaving a freestanding component structure along crystallographic lattice planes of epitaxial layers.

13. A method of producing an optical component, which comprises, separating, in accordance with the method according to claim 1, an optical component from a substrate during or after a manufacture thereof.

14. The method according to claim 13, wherein the optical component is a component selected from the group consisting of diffraction gratings, thin film filters, optical couplers, and waveguides.

15. A method of separating two layers of material from one another and substantially completely preserving each of the two layers of material, the method which comprises:

providing two layers of material having an interface boundary between the two layers, one of the two layers of material being a substrate and the other of the two layers of material being a semiconductor body formed at least partially of a material selected from the group consisting of GaN, AlN, InN, mixed crystals thereof, layer sequences, layer structures, and component structures thereof;

irradiating the interface boundary between the two layers or a region in vicinity of the interface boundary with electromagnetic radiation through the substrate;

absorbing the electromagnetic radiation at the interface or in the region in the vicinity of the interface and inducing a material at the interface boundary to decompose; and separating the two layers of material.

16. A method of separating two layers of material from one another and substantially completely preserving each of the two layers of material, the method which comprises:

providing two layers of material having an interface boundary between the two layers;

providing a sacrificial layer at the interface boundary, the sacrificial layer formed at least partially of a nitride material selected from the group consisting of GaN, AlN, InN, and mixed crystals thereof;

irradiating the interface boundary between the two layers or a region in vicinity of the interface boundary with electromagnetic radiation through one of the two layers;

absorbing the electromagnetic radiation at the interface or in the region in the vicinity of the interface with the sacrificial layer and decomposing the sacrificial layer; and separating the two layers of material.

17. A method of laterally structuring a semiconductor layer or a semiconductor layer sequence disposed on a substrate, the method which comprises:

providing a substrate and a body of semiconductor material consisting essentially of at least one group III nitride material on the substrate, with an interface formed between the substrate and the semiconductor material;

irradiating the interface boundary or a region in vicinity of the interface boundary through one of the substrate and the semiconductor material;

absorbing the electromagnetic radiation at the interface boundary or in the region in the vicinity of the interface boundary and thereby inducing a decomposition of material at the interface boundary.

18. The process according to claim 17, which further comprises providing a sacrificial layer at the interface and wherein the absorbing step comprises absorbing the radiation with the sacrificial layer and decomposing the sacrificial layer.

19. The process according to claim 18, wherein the sacrificial layer is formed of a material having an optical band gap smaller than a band gap of one of the two layers.

20. The process according to claim 17, wherein the absorbing step comprises inducing the decomposition by converting an energy of the absorbed radiation into heat.

21. The process according to claim 17, which further comprises forming a temperature-sensitive sacrificial layer at the boundary interface, and wherein the absorbing step comprises absorbing the radiation in a part of one of the layers of material, diffusing the energy in form of heat into the temperature-sensitive sacrificial layer, and decomposing the sacrificial layer.

22. The process according to claim 17, wherein the absorbing step comprises inducing a decomposition of the interface boundary by generating gas at the interface boundary with energy of the absorbed radiation.

23. The process according to claim 22, wherein the step of generating the gas comprises inducing a process selected from the group consisting of chemical reactions and sublimation.

24. The process according to claim 17, wherein the irradiating step comprises exposing the material to one or more light pulses.

25. The process according to claim 17, wherein the irradiating step comprises irradiating with two or more coherent laser beams, producing an interference pattern in the exposure, and increasing a local light intensity.

26. The process according to claim 17, wherein the substrate consists essentially of a material selected from the group consisting of sapphire, $LiAlO_2$, $LiGaO_2$, $MgAl_2O_4$, $ScAlMgO_4$, and SiC.

27. The process according to claim 26, wherein the substrate is a sapphire substrate and the semiconductor material includes a layer of a Ga compound selected from the group consisting of GaN and $In_xGa_{1-x}N$, and the irradiating step comprises separating the semiconductor from the sapphire substrate by exposing through the substrate with a third harmonic of a Nd:YAG laser at a wavelength of 355 nm.

28. The process according to claim 27, which comprises pulsing the Nd:YAG laser with a Q-switch.

* * * * *

UNITED STATES PATENT AND TRADEMARK OFFICE
CERTIFICATE OF CORRECTION

PATENT NO. : 6,559,075 B1  Page 1 of 1
DATED : May 6, 2003
INVENTOR(S) : Michael Kelly et al.

It is certified that error appears in the above-identified patent and that said Letters Patent is hereby corrected as shown below:

Column 9,
Line 57, should read as follows: -- providing two layers of material having an interface --

Signed and Sealed this

Twenty-fifth Day of November, 2003

JAMES E. ROGAN
*Director of the United States Patent and Trademark Office*